(12) United States Patent
Morita et al.

(10) Patent No.: US 9,620,666 B2
(45) Date of Patent: Apr. 11, 2017

(54) METHOD FOR FORMING AN IMPURITY DIFFUSION LAYER BY APPLYING A DIFFUSING AGENT COMPOSITION

(71) Applicant: Tokyo Ohka Kogyo Co., Ltd., Kawasaki-shi (JP)

(72) Inventors: Toshiro Morita, Kawasaki (JP); Takashi Kamizono, Kawasaki (JP)

(73) Assignee: Tokyo Ohka Kogyo Co., Ltd., Kawasaki-shi (JP)

(*) Notice: Subject to any disclaimer, the term of this patent is extended or adjusted under 35 U.S.C. 154(b) by 146 days.

(21) Appl. No.: 14/562,041

(22) Filed: Dec. 5, 2014

(65) Prior Publication Data

US 2015/0140718 A1    May 21, 2015

Related U.S. Application Data

(62) Division of application No. 13/292,461, filed on Nov. 9, 2011, now abandoned.

(30) Foreign Application Priority Data

Nov. 11, 2010   (JP) .................................. 2010-253234

(51) Int. Cl.
| | |
|---|---|
| *H01L 31/18* | (2006.01) |
| *H01L 21/22* | (2006.01) |
| *H01L 21/225* | (2006.01) |
| *H01L 31/068* | (2012.01) |
| *H01L 51/00* | (2006.01) |

(Continued)

(52) U.S. Cl.
CPC .......... *H01L 31/186* (2013.01); *H01L 21/228* (2013.01); *H01L 21/2225* (2013.01); *H01L 21/2254* (2013.01); *H01L 31/0682* (2013.01); *H01L 31/1804* (2013.01); *H01L 51/0096* (2013.01); *H01L 51/448* (2013.01);

(Continued)

(58) Field of Classification Search
None
See application file for complete search history.

(56) References Cited

U.S. PATENT DOCUMENTS

| | | | |
|---|---|---|---|
| 2009/0298290 A1 | 12/2009 | Kamimura | |
| 2011/0045624 A1* | 2/2011 | Tsukigata | ............ H01L 21/2225 438/57 |
| 2011/0263110 A1* | 10/2011 | Morita | .................... C08L 71/02 438/542 |

FOREIGN PATENT DOCUMENTS

| | | |
|---|---|---|
| CN | 101167191 A | 4/2008 |
| JP | A-2003-168810 | 6/2003 |

(Continued)

OTHER PUBLICATIONS

Sigma-Aldrich. USA Online Product Directory for "Organic Phosphates/Phosphites"; table attached to case file as a PDF, pp. 1-4; website address is http://www.sigmaaldrich.com/chemistry/chemistry-products.html?TablePage=16250753.*

(Continued)

*Primary Examiner* — Harold Pyon
*Assistant Examiner* — Katie L Hammer
(74) *Attorney, Agent, or Firm* — Knobbe, Martens, Olson & Bear LLP

(57) ABSTRACT

A diffusing agent composition including a condensation product and an impurity diffusion component. The condensation product is a reaction product resulting from hydrolysis of an alkoxysilane. The impurity diffusion component is a monoester or diester of phosphoric acid, or a mixture thereof.

5 Claims, 1 Drawing Sheet

(51) Int. Cl.
    *H01L 51/44*    (2006.01)
    *H01L 51/52*    (2006.01)
    *H01L 21/228*   (2006.01)

(52) U.S. Cl.
    CPC ........ *H01L 51/5253* (2013.01); *Y02E 10/547* (2013.01); *Y02E 10/549* (2013.01); *Y02P 70/521* (2015.11)

(56) References Cited

FOREIGN PATENT DOCUMENTS

| JP | A-2003-332606 | 11/2003 | |
|---|---|---|---|
| JP | A-2006-156646 | 6/2006 | |
| TW | 2008/11928 A | 3/2008 | |
| WO | WO 2009116569 A1 * | 9/2009 | ......... H01L 21/2225 |
| WO | WO 2009/125787 A1 | 10/2009 | |

OTHER PUBLICATIONS

Wasow, Guenther W. "Phosphorus-Containing Anionic Surfactants," Anionic Surfactants: Organic Chemistry, edited by Helmut W. Stache, Surfactant Science Series, vol. 56, 1996, introduction pp. 1-4 and article pp. 551-560.

Office Action in Chinese Patent Application No. 201110365158.5, issued on Feb. 28, 2015.

Office Action for Taiwanese Patent Application No. 100139944, mailed Apr. 10, 2015.

Decision of Refusal in corresponding Taiwanese Patent Application No. 100139944, dated Jul. 30, 2015.

* cited by examiner

METHOD FOR FORMING AN IMPURITY DIFFUSION LAYER BY APPLYING A DIFFUSING AGENT COMPOSITION

RELATED APPLICATIONS

This application is a divisional of U.S. patent application Ser. No. 13/292,461, filed Nov. 9, 2011, which claims priority under 35 U.S.C. §119(a)-(e) to Japanese Patent Application No. 2010-253234, filed Nov. 11, 2010, the content of which is incorporated herein by reference.

BACKGROUND OF THE INVENTION

1. Field of the Invention

The present invention relates to a diffusing agent composition, and a method for forming an impurity diffusion layer.

2. Description of the Related Art

According to the related art, an N-type impurity diffusion layer in a semiconductor substrate of a solar cell is formed by applying an diffusing agent that contains an N-type impurity diffusion component to a surface of the semiconductor substrate, and causing the N-type impurity diffusion component to diffuse from the applied diffusing agent. Specifically, a thermally oxidized film is first formed on a surface of a semiconductor substrate, and subsequently a photolithographic method is used to laminate a resist having a predetermined pattern onto the thermally oxidized film. The resist is used as a mask to etch, with an acid or alkali, regions of the thermally oxidized film that are not masked by the resist, and then the resist is peeled to form a mask of the thermally oxidized film. A diffusing agent which contains an N-type impurity diffusion component is applied thereto, thereby forming a diffusion film in regions in which openings in the mask are positioned. The regions are heated to a high temperature to cause the diffusing agent to diffuse into the regions, thereby forming an N-type impurity diffusion layer.

In recent years, suggestions have been made about methods of using an ink-jet method to pattern a surface of a semiconductor substrate with a diffusing agent into (see, for example, Japanese Patent Application Laid-Open JP-A No. 2003-168810, JP-A No. 2003-332606, and JP-A No. 2006-156646). In the ink-jet method, the diffusing agent is jetted from ink-jet nozzles to an impurity diffusion layer region for selective patterning. Thus, as compared with conventional photolithographic methods, the ink-jet method does not require any complicated step, and makes it possible to make a pattern easily while also reducing the amount of liquid to be used.

In conventional diffusing agents, phosphorus pentaoxide has been used as a source for supplying phosphorus, which is to be an N-type impurity diffusion component. In the application of a diffusing agent by a spin coating method, the concentration of a solid component ($SiO_2$ or $P_2O_5$) can be set to a relatively low value; thus, a change of the solution used for the application with the passage of time is permissible. However, in the case of using an ink-jet method to pattern a semiconductor substrate surface with a diffusing agent in an attempt to save a painting solution to be used or to save process costs, a sufficient painted film thickness cannot be obtained unless the concentration of a solid component in the painting solution is high to some degree. However, in a case where a dehydration condensed product based on an Si compound is contained in the diffusing agent, the condensing reaction will progress rapidly when the solid component concentration in the painting solution is made high. As a result, there is caused a problem that the painting solution is remarkably deteriorated in storage stability.

SUMMARY OF THE INVENTION

In light of such problems, the invention has been made. An object of the invention is to provide a technique making it possible to improve the storage stability of a diffusing agent composition which can be used to print an N-type impurity diffusion component onto a semiconductor substrate, and simultaneously improve the diffusibility of the impurity diffusion component into the semiconductor substrate.

An aspect of the invention is a diffusing agent composition. The diffusing agent composition is a diffusing agent composition used to print an impurity diffusion component onto a semiconductor substrate. The diffusing agent composition contains a condensation product (A) made from a starting material that is an alkoxysilane represented by the following general formula (1), and an impurity diffusion component (B), as the impurity diffusion component:

[Chemical Formula 1]

$$R^1{}_m\text{—Si—}(OR^2)_{4-m} \quad (1)$$

wherein $R^1$ and $R^2$ are each an organic group, each of a plurality of $R^1$s or $R^2$s may be the same or different from each other, and m is 0, 1 or 2. The impurity diffusion component (B) is characterized by being a phosphate (C) represented by the following general formula (2):

[Chemical Formula 2]

$$(HO)_n\text{—}\overset{\overset{\displaystyle O}{\|}}{P}\text{—}(OR^3)_{3-n} \quad (2)$$

wherein $R^3$ is an alkyl group, and n is 1 or 2.

The diffusing agent composition of this aspect can be restrained from being lowered in storage stability even when the concentration of the impurity diffusion component (B) is made high to enable the composition to give a sufficient painted film thickness. As a result, the diffusibility of the impurity diffusion component into a semiconductor substrate can be improved.

Another aspect of the invention is a method for forming an impurity diffusion layer. This method for forming an impurity diffusion layer includes a pattern forming step of applying the diffusing agent composition of the abovementioned aspect to a semiconductor substrate, thereby forming a pattern, and a diffusing step of diffusing the impurity diffusion component (B) of the diffusing agent composition into the semiconductor substrate.

DETAILED DESCRIPTION OF THE INVENTION

Figure 1A:
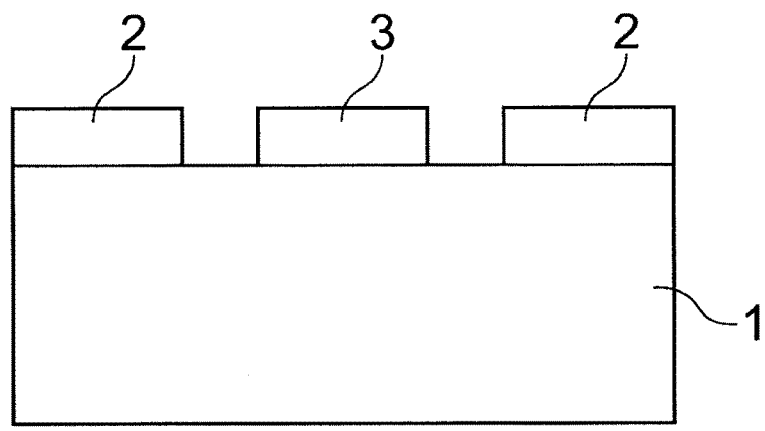
FIG. 1A to FIG. 1C are each a process sectional view referred to in order to describe a solar-cell-producing process including a method according to an embodiment of the invention for forming an impurity diffusion layer.

The invention will now be described by reference to the preferred embodiments. This does not intend to limit the scope of the present invention, but to exemplify the invention.

A diffusing agent composition according to one of the embodiments is used to diffuse an impurity diffusion component into a semiconductor substrate. The semiconductor substrate may be used as a substrate for a solar cell. The diffusing agent composition contains a condensation product (A) and an impurity diffusion component (B).

(A) Condensation Product:

The condensation product (A) is a reaction product made from a starting material that is an alkoxysilane represented by the following general formula (1), and obtained by hydrolyzing the alkoxysilane:

[Chemical Formula 3]

$$R^1_m\text{—}Si\text{—}(OR^2)_{4-m} \qquad (1)$$

wherein $R^1$ and $R^2$ are each an organic group, each of a plurality of $R^1$s or $R^2$s may be the same or different from each other, and m is 0, 1 or 2.

In the condensation product (A), examples of each of $R^1$ and $R^2$ include alkyl, phenyl and epoxy groups, and a group represented by —$R^5$—$R^4$ wherein $R^4$ is an aryl group, or a group containing an ethylenically unsaturated double bond, and $R^5$ is an alkylene group having 1 to 9 carbon atoms. The alkoxysilane may have different $R^5$.

The alkyl group as each of $R^1$ and $R^2$ may be an alkyl group having 1 to 10 carbon atoms, and examples thereof include linear alkyl groups such as methyl, ethyl, propyl, butyl, pentyl, hexyl, heptyl, octyl, nonyl, and decyl groups; branched alkyl groups such as 1-methylethyl, 1-methylpropyl, 2-methylpropyl, 1-methylbutyl, 2-methylbutyl, 3-methylbuytl, 1-ethylbutyl, 2-ethylbutyl, 1-methylpentyl, 2-methylpentyl, 3-methylpentyl, and 4-methylpentyl groups; and cyclic alkyl groups such as cyclopentyl, cyclohexyl, adamanthyl, norbornyl, isobornyl, and tricyclodecanyl groups. The alkyl group is preferably an alkyl group having 1 to 5 carbon atoms, more preferably an alkyl group having 1 to 3 carbon atoms, in particular preferably a methyl group.

Examples of the aryl group as each of $R^1$ and $R^2$ include phenyl, biphenyl, fluorenyl, naphthyl, anthryl, and phenanthryl groups. The aryl group is preferably a phenyl group. The aryl group as each of $R^1$ and $R^2$ may have a substituent such as an alkyl group.

The epoxy group as each of $R^1$ and $R^2$ may be an epoxy group having 3 to 10 carbon atoms, and is preferably an epoxy group having 3 to 7 carbon atoms.

In the condensation product (A), the alkylene group having 1 to 9 carbon atoms as $R^5$ may be a linear or branched alkylene group. The alkylene group is preferably a linear alkylene group having 1 to 7 carbon atoms, more preferably a linear alkylene group having 1 to 5 carbon atoms, in particular preferably a methylene, ethylene or n-propylene group.

In the condensation product (A), the group having an ethylenically unsaturated double bond as $R^4$ is preferably a group having, at its terminal, an ethylenically unsaturated double bond, in particular preferably a group represented by the following formula:

[Chemical Formula 4]

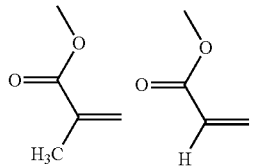

In the condensation product (A), examples of the aryl group as $R^4$ are the same as described as the examples of the aryl group as each of $R^1$ and $R^2$.

When m in the general formula (1) is 0, a silane compound (i) as the alkoxy silane is represented by the following general formula (3):

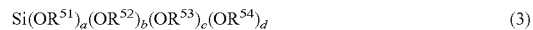
$$Si(OR^{51})_a(OR^{52})_b(OR^{53})_c(OR^{54})_d \qquad (3)$$

wherein $R^{51}$, $R^{52}$, $R^{53}$ and $R^{54}$ each independently represent the same organic group as defined for $R^2$; and a, b, c and d are each an integer satisfying the following: $0 \le a \le 4$, $0 \le b \le 4$, $0 \le c \le 4$, and $0 \le d \le 4$, and $a+b+c+d+=4$.

When m in the general formula (1) is 1, a silane compound (ii) as the alkoxy silane is represented by the following general formula (4):

$$R^{65}Si(OR^{66})_e(OR^{67})_f(OR^{68})_g \qquad (4)$$

wherein $R^{65}$ represents the same organic group as defined for (each Of) $R^1$; $R^{66}$, $R^{67}$, and $R^{68}$ each independently represent the same organic group as defined for $R^2$; and e, f, and g are each an integer satisfying the following: $0 \le e \le 3$, $0 \le f \le 3$, and $0 \le g \le 3$, and $e+f+g=3$.

When m in the general formula (1) is 2, a silane compound (iii) as the alkoxy silane is represented by the following general formula (5):

$$R^{70}R^{71}Si(OR^{72})_h(OR^{73})_i \qquad (5)$$

wherein $R^{70}$ and $R^{71}$ each independently represent the same organic group as defined for $R^1$; $R^{72}$, and $R^{73}$ each independently represent the same organic group as defined for $R^2$; and h and i are each an integer satisfying the following: $0 \le h \le 2$, and $0 \le i \le 2$, and $h+i=2$.

The condensation product (A) may be prepared by a method of hydrolyzing one or more selected from the above-mentioned alkoxysilanes (i) to (iii) in the presence of an acid catalyst, water, and an organic solvent. The acid catalyst may be an organic acid, or an inorganic acid. The inorganic acid may be, for example, sulfuric acid, phosphoric acid, nitric acid or hydrochloric acid, and is preferably phosphoric acid or nitric acid. The organic acid may be a carboxylic acid such as formic acid, oxalic acid, fumaric acid, maleic acid, glacial acetic acid, acetic anhydride, propionic acid, or n-butyric acid, or an organic acid having a sulfur-containing-acid residue. The organic acid having a sulfur-containing-acid residue may be, for example, an organic sulfonic acid. An esterified product thereof may be used, examples thereof including organic sulfates and organic sulfites. Of these examples, an organic sulfonic acid, for example, a compound represented by the following general formula (6) is particularly preferred:

$$R^{13}\text{—}X \qquad (6)$$

wherein $R^{13}$ is a hydrocarbon group which may have a substituent, and X is a sulfonic acid group (i.e., a sulfate group).

In the general formula (6), the hydrocarbon group as $R^{13}$ is preferably a hydrocarbon group having 1 to 20 carbon atoms. This hydrocarbon group may be a saturated or unsaturated group, and may be any one of linear, branched and cyclic groups. When the hydrocarbon group as $R^{13}$ is cyclic, the group is preferably, for example, an aromatic hydrocarbon group such as a phenyl, naphthyl or anthryl group, and is in particular preferably a phenyl group. In this aromatic hydrocarbon group, it is allowable to bond, to the aromatic ring thereof, one or more hydrocarbon groups (each) having 1 to 20 carbon atoms as one or more substituents. The hydrocarbon group as the substituent on the aromatic ring may be a saturated or unsaturated group, and may be any one of linear, branched and cyclic groups. The hydrocarbon group as $R^{13}$ may have one or more substituents. Examples of the substituent include halogen atoms such as fluorine atoms; and sulfonic acid, carboxyl, amino, and cyano groups.

The acid catalyst acts as a catalyst when the alkoxysilane is hydrolyzed in the presence of water. The amount of the used acid catalyst is preferably adjusted to set the catalyst concentration in the reaction system for the hydrolysis reaction into the range of 1 to 1000 ppm, in particular, into that of 5 to 800 ppm. In accordance with the addition amount of water, the hydrolysis rate of the siloxane polymer is varied; thus, the amount is decided, correspondingly to the hydrolysis rate to be attained.

Examples of the organic solvent in the reaction system for the hydrolysis reaction include monohydric alcohols such as methanol, ethanol, propanol, isopropanol (IPA), and n-butanol; alkyl carbonates such as methyl 3-methoxypropionate, and ethyl 3-ethoxypropionate; polyhydric alcohols such as ethylene glycol, diethylene glycol, propylene glycol, glycerin, trimethylolpropane, and hexanetriol; monoethers of a polyhydric alcohol, such as ethylene glycol monomethyl ether, ethylene glycol monoethyl ether, ethylene glycol monopropyl ether, ethylene glycol monobutyl ether, diethylene glycol monomethyl ether, diethylene glycol monoethyl ether, diethylene glycol monopropyl ether, diethylene glycol monobutyl ether, propylene glycol monomethyl ether, propylene glycol monoethyl ether, propylene glycol monopropyl ether and propylene glycol monobutyl ether, and a monoacetate of any one of these compounds; esters such as methyl acetate, ethyl acetate, and butyl acetate; ketones such as acetone, methyl ethyl ketone, and methyl isoamyl ketone; polyhydric alcohol ethers each obtained by alkyl-etherizing all hydroxyl groups of a polyhydric alcohol, such as ethylene glycol dimethyl ether, ethylene glycol diethyl ether, ethylene glycol dipropyl ether, ethylene glycol dibutyl ether, propylene glycol dimethyl ether, propylene glycol diethyl ether, diethylene glycol dimethyl ether, diethylene glycol diethyl ether, and diethylene glycol methyl ethyl ether. These organic solvents may be used alone or in combination of two or more thereof.

In such a reaction system, the alkoxysilane is hydrolyzed to yield the condensation product (A), that is, a siloxane polymer. The hydrolysis reaction is completed usually in a period of about 5 to 100 hours. In order to make the reaction period short, it is preferred to heat the system into the range of temperatures not higher than 80° C.

After the end of the reaction, a reaction solution is yielded which contains the synthesized condensation product (A) and the organic solvent used for the reaction. The siloxane polymer can be obtained by the above-mentioned method in the state that the polymer is separated from the organic solvent in a conventionally known manner, and is in a dry solid form or in the form of a solution wherein the solvent is optionally substituted with another solution.

(B) Impurity Diffusion Component:

The impurity diffusion component (B) is a phosphate (C) represented by the following general formula (2):

[Chemical Formula 5]

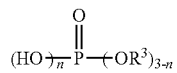

(2)

wherein $R^3$ is an alkyl group, and n is 1 (so that the present ester is a diester) or 2 (so that the ester is a monoester).

Specific examples of the phosphate (C) include dibutyl phosphate, monobutyl phosphate, monoethyl phosphate, diethyl phosphate, monopropyl phosphate, and dipropyl phosphate.

The content by percentage of the phosphate (C) in the diffusing agent composition is preferably 50% or less by mass of the whole of the composition. If the content by percentage of the phosphate (C) is more than 50% by mass of the whole of the composition, the storage stability of the diffusing agent composition declines.

The composition may contain water; however, the water content by percentage is preferably 1% at most by mass of the whole of the composition, more preferably 0.5% or less by mass thereof. Most preferably, the composition contains no water. According to this preferred embodiment, the storage stability of the diffusing agent composition can be made higher.

The diffusing agent composition of the present embodiment may contains, as other components, a surfactant, a solvent component, and any additive. When the composition contains a surfactant, the composition can be improved in paintability, flattenability and developability, and in a diffusing agent composition layer formed after the painting thereof the generation of unevenness in the painted layer-tissue can be reduced. The surfactant may be a surfactant conventionally known, and is preferably a silicone surfactant. The surfactant is contained in the diffusing agent composition in a proportion ranging preferably from 100 to 10000 parts by mass, more preferably from 300 to 5000 parts by mass, even more preferably from 500 to 3000 parts by mass per million of the whole of the diffusing agent composition. Even more preferably, the proportion is 2000 or less parts by mass per million thereof since the diffusing agent composition layer is excellent in peelability after the layer is subjected to diffusing treatment. About the surfactant, a single species thereof may be used, or a combination of two or more species thereof may be used.

The solvent component is not particularly limited, and examples thereof include alcohols such as methanol, ethanol, isopropanol, and butanol; ketones such as acetone, diethyl ketone, and methyl ethyl ketone; esters such as methyl acetate, ethyl acetate, and butyl acetate; polyhydric alcohols such as propylene glycol, glycerin, and dipropylene glycol; ethers such as dipropylene glycol dimethyl ether, ethylene glycol dimethyl ether, ethylene glycol diethyl ether, propylene glycol dimethyl ether, and propylene glycol diethyl ether; monoether-moiety-containing glycols such as ethylene glycol monomethyl ether, ethylene glycol monoethyl ether, propylene glycol monomethyl ether, propylene glycol monoethyl ether, and dipropylene glycol monomethyl ether; cyclic ethers such as tetrahydrofuran, and dioxane; ether-moiety-containing esters such as propylene glycol monomethyl ether acetate, and propylene glycol monoethyl ether acetate.

The additive may be optionally added to the composition in order to adjust the viscosity or some other property of the diffusing agent composition. The additive is, for example, polypropylene glycol.

The diffusing agent composition that has been described above can be restrained from being lowered in storage stability even when the concentration of the impurity diffusion component (B) is made high in order to enable the composition to give a sufficient painted film thickness. As a result, the diffusibility of the impurity diffusion component to a semiconductor substrate can be improved.

Figure 1B:
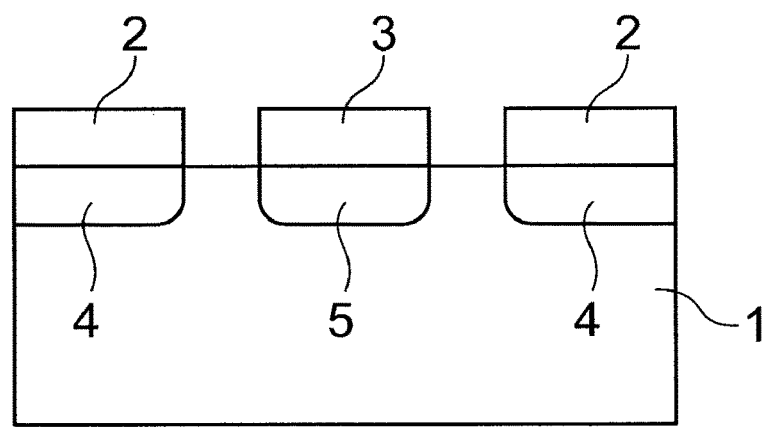
Figure 1C:
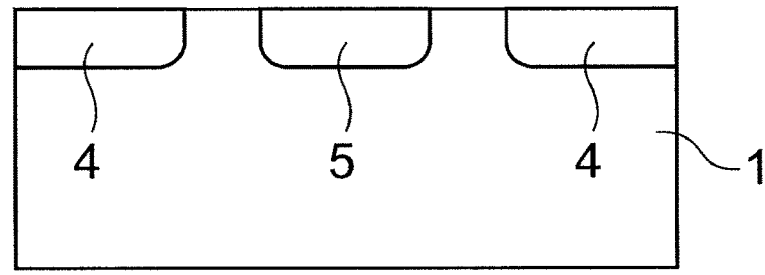

Method for Forming an Impurity Diffusion Layer, and Method for Producing a Solar Cell:

With reference to FIG. 1, a description is made about a method for forming an impurity diffusion layer, including the step of using an ink-jet manner to jet out, onto an N-type semiconductor substrate, the above-mentioned diffusing agent composition which is a composition containing an N-type impurity diffusion component (B), thereby forming a pattern, and the step of diffusing the impurity diffusion component (B) in the diffusing agent composition into the semiconductor substrate; and a method for producing a solar cell having the semiconductor substrate on which the impurity diffusion layer is formed by this impurity-diffusion-layer-forming method. FIG. 1A to FIG. 1C are each a process sectional view referred to in order to describe the solar-cell-producing method, which includes the impurity-diffusion-layer-forming method according to this embodiment.

As illustrated in FIG. 1A, first, a diffusing agent composition 2 as described above, which contains an N-type impurity diffusion component (B), and a diffusing agent composition 3 containing a P-type impurity diffusion component are selectively painted onto an N-type semiconductor substrate 1 such as a silicon substrate. The diffusing agent composition 3, which contains the P-type impurity diffusion component, is prepared in a well-known way. The diffusing agent composition 3 is painted onto the whole of a surface of the semiconductor substrate 1 in a well-known way, for example, spin coating, and then a well-known means, such as an oven, is used to dry the painted diffusing agent composition 3. A photolithographic manner and an etching manner that are each well-known are used to form the diffusing agent composition 3 into a pattern form. An ink-jet manner may be used to paint the diffusing agent composition 3 selectively onto a surface of the semiconductor substrate 1, thereby making a pattern.

The diffusing agent composition 2 is selectively painted onto the surface of the semiconductor substrate 1 in an ink-jet manner, so as to be made into a pattern form. Specifically, from ink-jet nozzles of a well-known ink-jet machine, the diffusing agent composition 2 is jetted out onto regions of the semiconductor substrate 1 where an N-type impurity diffusion layer is to be formed, thereby making a pattern of the composition 2. After the formation of the pattern, a well-known means, such as an oven, is used to harden and dry the painted diffusing agent composition 2.

The ink-jet machine may be an ink-jetting-out machine in a piezoelectric mode, wherein a piezoelectric element, which is deformable by receiving the application of a voltage, is used. The ink-jet machine may be an ink-jetting-out machine in a thermal mode, wherein bubbles generated by heating are used, or some other machine.

Next, as illustrated in FIG. 1B, the semiconductor substrate 1 on which the diffusing agent composition 2 and the diffusing agent composition 3 are patterned is set inside a diffusing furnace, such as an electric furnace, and then fired to diffuse the N-type impurity diffusion component (B) in the diffusing agent composition 2 and the P-type impurity diffusion component in the diffusing agent composition 3 from the surface of the semiconductor substrate 1 to the inside of the semiconductor substrate 1. By the radiation of a commonly-usable laser instead of the setting in the diffusing furnace, the semiconductor substrate 1 may be heated. In this way, the N-type impurity diffusion component (B) is diffused into the semiconductor substrate 1 to form an N-type impurity diffusion layer 4, and further the P-type impurity diffusion component is diffused into the semiconductor substrate 1 to form a P-type impurity diffusion layer 5.

Next, as illustrated in FIG. 1C, the oxide film formed on the surface of the semiconductor substrate is removed in a well-known etching manner. Through the above-mentioned steps, the impurity diffusion layers can be formed.

The invention is not limited to the above-mentioned embodiments, and various modifications, such as a design change, may be added thereto on the basis of knowledge of those skilled in the art. It should be understood that any embodiment to which one or more of the modifications are added is also included in the scope of the invention.

EXAMPLES

Hereinafter, examples of the invention will be described; however, these examples merely exemplify the invention in order to describe the invention appropriately, and never limit the invention.

In Table 1 are shown individual components of each of diffusing agent compositions of Examples 1 to 7 and Comparative Examples 1 and 2, and the content by percentage of each of the components.

TABLE 1

| | CONDENSATION PRODUCT (A) | | | | IMPURITY DIFFUSION COMPONENT (B) | | P-ATOM CONVERTED |
|---|---|---|---|---|---|---|---|
| | COMPONENT | CONTENT BY PERCENTAGE (wt %) | COMPONENT | CONTENT BY PERCENTAGE (wt %) | COMPONENT | CONTENT BY PERCENTAGE (wt %) | CONTENT BY PERCENTAGE (wt %) |
| EXAMPLE 1 | A-1 | 6.37 | A-2 | 6.37 | DIBUTYL PHOSPHATE | 30.0 | 4.4 |
| EXAMPLE 2 | A-1 | 6.37 | A-2 | 6.37 | MONOETHYL PHOSPHATE/ DIETHYL PHOSPHATE | 25.9 | 4.4 |
| EXAMPLE 3 | A-1 | 6.37 | A-2 | 6.37 | MONOPROPYL PHOSPHATE/ DIPROPYL PHOSPHATE | 31.9 | 4.4 |
| COMPARATIVE EXAMPLE 1 | A-1 | 6.37 | A-2 | 6.37 | PHOSPHORUS | 10.1 | 4.4 |

TABLE 1-continued

| | | | | | PENTAOXIDE | | |
|---|---|---|---|---|---|---|---|
| COMPARATIVE EXAMPLE 2 | A-1 | 6.37 | A-2 | 6.37 | TRIBUTYL PHOSPHATE | 37.9 | 4.4 |
| EXAMPLE 4 | A-1 | 3.75 | A-3 | 11.25 | DIBUTYL PHOSPHATE | 34.6 | 5.1 |
| EXAMPLE 5 | A-1 | 3.75 | A-3 | 11.25 | DIBUTYL PHOSPHATE | 20.7 | 3.1 |
| EXAMPLE 6 | — | — | A-3 | 18.00 | DIBUTYL PHOSPHATE | 33.2 | 4.9 |

| | OTHER COMPONENT | | ORGANIC SOLVENT | | WATER |
|---|---|---|---|---|---|
| | COMPONENT | CONTENT BY PERCENTAGE (wt %) | COMPONENT | CONTENT BY PERCENTAGE (wt %) | CONTENT BY PERCENTAGE (wt %) |
| EXAMPLE 1 | TiO$_2$ | 0.26 | DPGM | 56.7 | 0.3 |
| EXAMPLE 2 | TiO$_2$ | 0.26 | DPGM | 60.8 | 0.3 |
| EXAMPLE 3 | TiO$_2$ | 0.26 | DPGM | 54.8 | 0.3 |
| COMPARATIVE EXAMPLE 1 | TiO$_2$ | 0.26 | DPGM | 76.6 | 0.3 |
| COMPARATIVE EXAMPLE 2 | TiO$_2$ | 0.26 | DPGM | 48.8 | 0.3 |
| EXAMPLE 4 | — | — | DPGM | 50.1 | 0.3 |
| EXAMPLE 5 | — | — | DPGM | 64.0 | 0.3 |
| EXAMPLE 6 | POLYPROPYLENE GLYCOL | 2 | DPGM | 46.5 | 0.3 |

The component A-1 shown in Table 1 is a hydrolyzate of Si(OC$_2$H$_5$)$_4$. The components A-2 and A-3 shown in Table 1 are condensation products represented by the following formulae, respectively, and DPGM shown in Table 1 is an abbreviation of dipropylene glycol monomethyl ether:

[Chemical Formula 6]

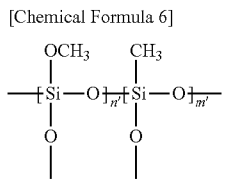

wherein n'/m'=20/80 to 50/50 (the component A-2), and

[Chemical Formula 7]

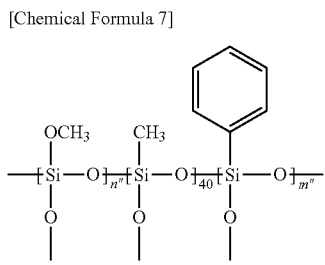

wherein n"/m"=40/20 to 50/10 (the component A-3).

Viscosity Evaluation:

A Cannon-Fenske viscometer was used to measure the initial viscosity of each of phosphate-containing diffusing agent compositions of Examples 1 and 4 to 6, and non-phosphate-containing one of Comparative Example 1. Furthermore, each of the diffusing agent compositions of Examples 1 and 4 to 6, and Comparative Example 1 was stored at 5° C., and the Cannon-Fenske viscometer was used to measure the viscosity thereof after two days elapsed, as well as after six days elapsed. In Table 2 are shown viscosity evaluation results of Examples 1 and 4 to 6, and Comparative Example 1. In the Table 2, inside parentheses is shown the percentage of each of the viscosities after the two days elapsed, as well as after the six days elapsed, to the initial viscosity concerned.

TABLE 2

| | Initial viscosity (mPa · s) | Viscosity (mPa · s) after 2 days | Viscosity (mPa · s) after 6 days |
|---|---|---|---|
| Example 1 | 8.54 | 8.55 (100.1%) | 9.03 (105.7%) |
| Comparative Example 1 | 8.32 | 8.57 (103.0%) | 9.72 (116.8%) |
| Example 4 | 10.25 | 10.58 (103.2%) | 10.58 (103.2%) |
| Example 5 | 7.79 | 8.01 (102.8%) | 7.82 (100.3%) |
| Example 6 | 10.53 | 10.48 (99.5%) | 10.52 (99.9%) |

The phosphorus equivalent (the mole number of phosphorus) in the diffusing agent composition of Example 1 was equivalent to that in the diffusing agent composition of Comparative Example 1. As shown in Table 2, however, after the two days, and after the six days, the viscosity of the diffusing agent composition of Comparative Example 1 increased sharply while the viscosity of each of the diffusing agent compositions of Examples 1 and 4 to 6 fell below at most about 105.7% of the initial viscosity even after the six days. Thus, it was verified that the diffusing agent composition of Example 1 was excellent in storage stability. It was found out that, in particular, about the diffusing agent compositions of Examples 5 and 6, the viscosity after the six days was not substantially changed from the initial viscosity.

Measurement of Sheet Resistivities:

The diffusing agent compositions of Examples 1 to 3, and Comparative Examples 1 and 2 were each used, and painted onto each of P-type Si substrates (surface orientation: <100>, and resistivity: 5 to 15 Ω·cm) in a spin coating manner. The film thickness of the diffusing agent composition painted on each of the Si substrates was about 7000 Å. The workpieces were each prebaked at 100° C. and 200° C. for respective periods of one minute, and then a heating furnace (VF-1000, manufactured by Koyo Thermo Systems Co., Ltd.) was used to heat the workpiece at 950° C. in a nitrogen atmosphere for 30 minutes. Thereafter, the Si substrate was immersed in a 5% HF solution in water for 10 minutes to remove the oxide film on any surface of the substrate. About each of Examples 1 to 3 and Comparative Examples 1 and 2, the number of the formed samples was two. About each of the samples, at five points thereof, the respective sheet resistivities were measured by a four-probe method using a device (VR-70) manufactured by Hitachi Kokusai Electric Inc., so that about each of Examples 1 to 3 and Comparative Examples 1 and 2, the sheet resistivities at the 10 points were obtained in total. The average of the values at the 10 points was calculated. In Table 3 are shown the thus-obtained sheet resistivity averages.

TABLE 3

|  | Sheet resistivity (Ω/square) |
| --- | --- |
| Example 1 | 180 |
| Example 2 | 80 |
| Example 3 | 20 |
| Comparative Example 1 | 110 |
| Comparative Example 2 | 600 |

As shown in Table 3, in Example 1, the sheet resistivity was 180 Ω/square, and in Examples 2 and 3, the sheet resistivities were each as low as a value less than 100 Ω/square. Thus, it was verified that when the diffusing agent compositions of Examples 1 to 3 were used, the sheet resistivities were made largely better than when that of Comparative Example 2 was used. In other words, it was verified that the use of a mono- or di-ester compound of phosphoric acid makes better in diffusion efficiency than that of a tri-ester of phosphoric acid even when the phosphorus equivalent (the mole number of phosphorus) in the former ester is substantially equal to that in the latter ester. The diffusing agent composition of Comparative Example 1 was lower in sheet resistivity than that of Comparative Example 2. As describe above, however, the non-phosphate-containing diffusing agent composition of Comparative Example 1 did not overcome a problem that the change with the passage of time (increase in the viscosity) was large.

In Table 4 are shown individual components of each of diffusing agent compositions of Examples 7 to 9, and the content by percentage of each of the components. The diffusing agent compositions of Examples 7 to 9 were phosphate-containing diffusing agent compositions common to each other in the individual components of the condensation product (A) and the impurity diffusion component (B) and the content by percentage of each of the components while between these compositions the water content by percentage (% by weight) in the whole of each of the compositions was varied.

TABLE 4

| | CONDENSATION PRODUCT (A) | | | | IMPURITY DIFFUSION COMPONENT (B) | | | ORGANIC SOLVENT | | WATER |
| --- | --- | --- | --- | --- | --- | --- | --- | --- | --- | --- |
| | COMPONENT | CONTENT BY PERCENTAGE (wt %) | COMPONENT | CONTENT BY PERCENTAGE (wt %) | COMPONENT | CONTENT BY PERCENTAGE (wt %) | P-ATOM CONVERTED CONTENT BY PERCENTAGE (wt %) | COMPONENT | CONTENT BY PERCENTAGE (wt %) | CONTENT BY PERCENTAGE (wt %) |
| EXAMPLE 7 | A-1 | 7 | A-3 | 14.29 | DIBUTYL PHOSPHATE | 24.8 | 3.6 | DPGM | 53.6 | 0.3 |
| EXAMPLE 8 | A-1 | 7 | A-3 | 14.29 | DIBUTYL PHOSPHATE | 24.8 | 3.6 | DPGM | 52.9 | 1 |
| EXAMPLE 9 | A-1 | 7 | A-3 | 14.29 | DIBUTYL PHOSPHATE | 24.8 | 3.6 | DPGM | 51.9 | 2 |

The components A-1 and A-3, and DPGM shown in Table 4 are the same as in Table 1.

A Cannon-Fenske viscometer was used to measure the initial viscosity of each of the diffusing agent compositions of Examples 7 to 9. Furthermore, each of the diffusing agent compositions of Examples 7 to 9 was stored at 5° C., and the Cannon-Fenske viscometer was used to measure the viscosity thereof after three days elapsed, as well as after eight days elapsed. In Table 5 are shown viscosity evaluation results of the diffusing agent compositions of Examples 7 to 9. In Table 5, inside parentheses is shown the percentage of each of the viscosities after the three days elapsed, as well as after the eight days elapsed, to the initial viscosity concerned.

As shown in Table 5, after the eight days, the viscosity of the diffusing agent composition of Example 9, wherein the water content by percentage was largest among Examples 7 to 9, was 108.3% of the initial viscosity. By contrast, as has been shown in Table 2, about the diffusing agent composition of Comparative Example 1, after the six days, the viscosity was raised to 116.8% of the initial viscosity. Thus, it was verified that the diffusing agent compositions of Examples 7 to 9 were better in storage stability than that of Comparative Example 1. In particular, about the diffusing agent compositions of Examples 7 and 8, the viscosity after the eight days relative to the initial viscosity was remarkably lower than about that of Example 9. Thus, it was found out that when the water content by percentage in the composition of the invention is set to 1% or less by weight, the composition is largely improved in storage stability.

TABLE 5

| | Initial viscosity (mPa · s) | Viscosity (mPa · s) after 3 days | Viscosity (mPa · s) after 8 days |
| --- | --- | --- | --- |
| Example 7 | 9.81 | 9.81 (100.0%) | 9.98 (101.7%) |
| Example 8 | 11.09 | 11.20 (100.9%) | 11.53 (103.9%) |
| Example 9 | 12.23 | 12.63 (103.2%) | 13.25 (108.3%) |

What is claimed is:
1. A method for forming an impurity diffusion layer, comprising:
applying a diffusing agent composition to a semiconductor substrate, thereby forming a pattern, wherein the diffusing agent composition is used to print an impurity diffusion component onto a semiconductor substrate, and when the diffusing agent composition is applied to the semiconductor substrate, the diffusing agent composition comprises a mixture of a condensation product (A) made from a starting material that is an alkoxysilane represented by the following general formula (1):

  (1)

wherein each of $R^1$ and $R^2$ is an organic group, each of a plurality of $R^1$s or $R^2$s is the same or different, and m is 0, 1 or 2; and an impurity diffusion component (B), wherein the impurity diffusion component (B) is a phosphate (C) represented by the following general formula (2):

  (2)

wherein $R^3$ is an alkyl group, and n is 1 or 2, the method further comprising:

diffusing the impurity diffusion component (B) of the diffusing agent composition into the semiconductor substrate.

2. The method for forming an impurity diffusion layer according to claim 1, wherein the semiconductor substrate is used in a solar cell.

3. The method for forming an impurity diffusion layer according to claim 1, wherein the content by percentage of the phosphate (C) is 50% or less by mass of the whole composition.

4. The method for forming an impurity diffusion layer according to claim 1, wherein the water content by percentage is 1% at most by mass of the whole composition.

5. The method for forming an impurity diffusion layer according to claim 4, wherein the compositon contains 0% water.

* * * * *